United States Patent [19]

Kupfer

[11] Patent Number: 4,467,393
[45] Date of Patent: Aug. 21, 1984

[54] TRIMMING CAPACITOR

[75] Inventor: Karl H. Kupfer, Krefeld, Fed. Rep. of Germany

[73] Assignee: U.S. Philips Corporation, New York, N.Y.

[21] Appl. No.: 436,534

[22] Filed: Oct. 25, 1982

[30] Foreign Application Priority Data

Feb. 26, 1982 [DE]  Fed. Rep. of Germany ....... 3206920

[51] Int. Cl.³ .......................... H01G 3/16; H03J 3/20
[52] U.S. Cl. ..................................... 361/278; 334/80
[58] Field of Search ....................... 361/277, 278, 290; 334/78, 80, 82

[56] References Cited

U.S. PATENT DOCUMENTS

| 2,438,477 | 3/1948 | Dodds et al. | 334/80 X |
| 3,187,281 | 6/1965 | Weiner et al. | 334/82 |
| 4,251,849 | 2/1981 | Kawai | 361/278 |

Primary Examiner—Donald A. Griffin
Attorney, Agent, or Firm—Jack E. Haken; James J. Cannon, Jr.

[57] ABSTRACT

An electronic circuit with a trimming capacitor with a first electrode in the form of a flexible sheet metal lug which is arranged in confronting relationship with a rigid counter electrode in the form of a plate capacitor. The flexible sheet metal lug and the plate capacitor are rigidly connected to an insulating support, for example a circuit board, and the capacitance of the trimming capacitor can be adjusted by bending the sheet metal lug.

1 Claim, 3 Drawing Figures

TRIMMING CAPACITOR

BACKGROUND OF THE INVENTION

1. Field of the Invention

The invention relates to an electronic circuit with a trimming capacitor consisting of a flexible metal lug as a first electrode and a rigid counter electrode, the metal lug being arranged in confronting relationship with the counter electrode.

2. Description of the Prior Art

Trimmers are variable capacitors usually of small capacitance values. They serve for trimming and possibly readjusting critical circuits, usually oscillatory circuits. After the trimming operation their capacitance should no longer vary, for example, by mechanical influence or vibrations.

For input stages of radio and television apparatus, so-called tuners, a trimmer is known in which a sheet metal lug inside the sheet metal housing of the tuner is bent with respect to the wall of the housing to vary the capacitance.

When the sheet metal lug is bent in the direction of the wall of the tuner housing acting as mass, the capacitance is increased and when it is bent away from the wall of the housing the capacitance is reduced.

In this construction it has proved disadvantageous that the wall of the housing of the tuner is used as an electric counter electrode; pressure exerted on the housing of the tuner, for example, only by manipulation, can bend the wall of the housing, be it slightly, and hence the capacitance of the trimming capacitor is varied. For this reason an improved trimming capacitor has been suggested (German Patent Application No. P 31 10 084.8) which consists of a flexible metal lug arranged before a metal surface, the metal surface consisting of a U-shaped profiled sheet metal rigidly connected to an insulating carrier, the metal lug being provided oppositely to a major surface of the profiled sheet metal. Although with this embodiment the disadvantage has been removed that the capacitance is varied involuntarily, so for example by manipulation of the circuit in which the trimming capacitor is incorporated, the necessity exists to provide a U-shaped profiled sheet metal as a counter electrode opposite to the flexible metal lug, which required an additional process step.

It is the object of the invention to improve the electronic circuit with trimming capacitor described in the opening paragraph in such manner that the additional process step of incorporating a U-shaped profiled sheet metal as a counter electrode can be dispensed with but that the known advantages are maintained, namely that an unwanted movement of the capacitor electrodes by mechanical load and hence an undesired capacitance variation is avoided.

SUMMARY OF THE INVENTION

According to the invention this object is achieved in that the counter electrode is formed by a plate capacitor which is rigidly connected to an insulating support.

For a large-scale production the important advantage is hence obtained that neither a separate counter electrode in the form of a U-shaped profiled sheet metal has to be incorporated in the circuit nor that the counter electrode must be insulated separately because, for example, plate capacitors already have an insulating lacquer layer which may serve both as an insulation and as a dielectric for the low-capacitance trimmer. As a result of this simplified circuit construction considerable expenses for a large-scale manufacture are saved since trimming capacitors have to be incorporated all the same and additional process steps such as separate incorporation of a counter electrode and its insulation, can be saved.

The advantages resulting from the invention furthermore consist in that a comparatively rigid trimming capacitor of low initial capacitance can be made with comparatively low costs, the capacitance being not variable inadvertently, by manipulation of the circuit in which the trimming capacitor is incorporated. To achieve this the plate capacitor which functions as a counter electrode and the metal lug can be assembled on the same insulating base plate and can hence not be moved with respect to each other by vibrations and pressure on the housing frame.

An embodiment of the invention will be described with reference to the drawing and its operation will be explained in detail.

DESCRIPTION OF THE PREFERRED EMBODIMENT

Figure 1:
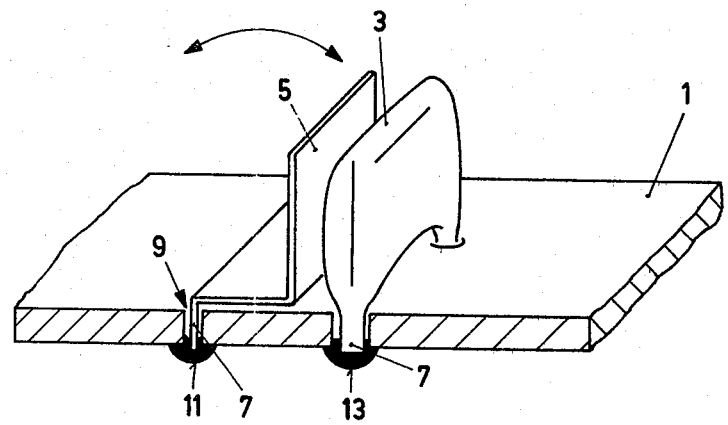
FIG. 1 is a perspective view of a trimming capacitor soldered on a circuit board.
Figure 2:
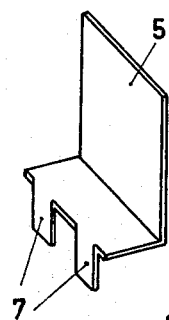
FIG. 2 is a perspective view of an enlarged scale of a flexible metal lug as a part of the trimming capacitor shown in FIG. 1.

FIG. 1 shows a trimming capacitor having a plate capacitor 3 and a metal lug 5 rigidly provided on an insulating support 1 in the form of a circuit board. As an individual part of the trimming capacitor, the metal lug 5 is shown on an enlarged scale in FIG. 2. The flexible metal lug 5 consists of a punched and bent part of, for example, 0.2 mm thick tin and is provided with soldering lugs 7 which are inserted in corresponding recesses 9 of the circuit board and which can be soldered to the circuit board. In the example described, soldering places 11 and 13 are shown on the lower side of the circuit board 1, the soldering place 11, for example, being the top of an oscillating circuit, the soldering place 13 to which soldering lugs 7 of a plate capacitor 3 are soldered then being the mass soldering place.

The value of the capacitance of the trimming capacitor depends on the area of the surface of the metal lug 5 as well as on the distance between the metal lug 5 and the plate capacitor 3. The distance can be varied by bending of the metal lug, capacitance and distance being inversely proportional. With an area of the metal lug 5 of 15 mm$^2$ to 36 mm$^2$, capacitances of 0.15 to 0.7 pF have been realized.

Figure 3:
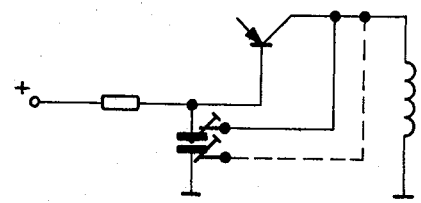
FIG. 3 is a diagrammatic drawing of an electric circuit.

FIG. 3 shows a diagrammatic drawing of an electric circuit in which the base capacitor of a transistor which is connected to mass at one end forms one electrode, while the flexible metal lug is connected to the top of an oscillatory circuit the resonant frequency of which can be varied by bending the lug towards the base capacitor.

What is claimed is:

1. An electronic circuit with a trimming capacitor consisting of a flexible metal lug as a first electrode and a rigid counter electrode, said metal lug being arranged in confronting relationship with said counter electrode, characterized in that:

said counter electrode is formed by a plate capacitor rigidly connected to an insulating support;

said metal lug being bendable for varying the capacitance of the trimming capacitor;

said metal lug being soldered to said insulating support; and said metal lug being a strip of a band of tin.

* * * * *